United States Patent [19]
Kim

[11] Patent Number: 5,923,976
[45] Date of Patent: Jul. 13, 1999

[54] NONVOLATILE MEMORY CELL AND METHOD OF FABRICATING THE SAME

[75] Inventor: Shi Ho Kim, Seoul, Rep. of Korea

[73] Assignee: LG Semicon Co., Ltd., Chungcheongbuk-do, Rep. of Korea

[21] Appl. No.: 08/819,211

[22] Filed: Mar. 17, 1997

Related U.S. Application Data

[62] Division of application No. 08/652,310, May 23, 1996, abandoned.

[30] Foreign Application Priority Data

Dec. 26, 1995 [KR] Rep. of Korea ............ 95/56312

[51] Int. Cl.⁶ .................................. H01L 21/8247
[52] U.S. Cl. ................... 438/261; 438/594; 438/264
[58] Field of Search ................... 438/257–267, 438/593–594

[56] References Cited

U.S. PATENT DOCUMENTS

| | | |
|---|---|---|
| 4,994,873 | 2/1991 | Madan ............................ 357/23.5 |
| 5,089,867 | 2/1992 | Lee ................................. 357/23.5 |
| 5,397,725 | 3/1995 | Wolstenholme et al. .......... 437/43 |
| 5,413,949 | 5/1995 | Hong . |
| 5,498,560 | 3/1996 | Sharma et al. . |
| 5,677,216 | 10/1997 | Tseng . |

FOREIGN PATENT DOCUMENTS 5-335588 12/1993 Japan .

*Primary Examiner*—Richard A. Booth
*Attorney, Agent, or Firm*—Finnegan, Henderson, Farabow, Garrett & Dunner, L.L.P.

[57] ABSTRACT

A nonvolatile memory cell is disclosed including a first conductivity-type substrate, an active region located in a predetermined portion of the first conductivity-type substrate, the active region including a second conductivity-type source and drain and a channel region placed between the source and drain, a floating gate having an inverse T-shape and formed on the surface of the substrate between the source and drain, and a control gate formed on the surface of the floating gate.

13 Claims, 6 Drawing Sheets

NONVOLATILE MEMORY CELL AND METHOD OF FABRICATING THE SAME

This is a divisional of application Ser. No. 08/652,310, filed May 23, 1996, now abandoned.

BACKGROUND OF THE INVENTION

1. Field of the Invention

The present invention relates to electrically programmable nonvolatile memory cells such as electrically programmable read only memories (EPROM), electrically erasable programmable read only memories (EEPROM), and flash memories. This invention further relates to a method of fabricating such a nonvolatile memory.

2. Description of the Prior Art

A conventional nonvolatile memory cell will be explained below with reference to FIGS. 1A, 1B, and 1C.

FIG. 1A is a plan view of a conventional nonvolatile memory cell. Referring to FIG. 1A, first, an active region 4 including a source 1, drain 2, and channel region 3 are formed. Then, a floating gate 5 is formed between the source 1 and drain 2. Both edge portions of the floating gate 5 are superposed on a portion of the source 1 and drain 2. A control gate 6 is formed perpendicular to the active region 4 and on the floating gate 5. The source 1, drain 2, channel region 3, and floating gate 5 form a MOS transistor.

FIG. 1B is a cross-sectional view, taken along line A–A' of FIG. 1A. The source 1 and drain 2, which have a predetermined spacing, are formed in a predetermined portion of a P-type substrate 7. A portion of the substrate 7 between the source 1 and drain 2 becomes the channel region 3. A gate insulating layer 8 is formed on a portion of the substrate 7 between the source 1 and drain 2, and is superposed on an edge portion of each of the source 1 and drain 2. The floating gate 5 and control gate 6 are sequentially formed on the gate insulating layer 8.

FIG. 1C is a cross-sectional view, taken along line B–B' of FIG. 1A. Referring to FIG. 1C, two channel stop regions 10a and 10b are formed on a predetermined portion of the P-type substrate 7 in order to electrically isolate adjacent cells from each other in a nonvolatile memory cell array. The region of the P-type substrate 7 between the channel stop regions 10a and 10b defines the width of the active region 4. The insulating layer 8 is formed on a portion of the P-type substrate 7 between the channel stop regions 10a and 10b and is superposed on an edge portion of each of the channel stop regions 10a and 10b. The floating gate 5 and control gate 6 are sequentially formed on the gate insulating layer 8. Referring to FIGS. 1A to 1C, as described above, the floating gate 5 acts as a gate electrode of the field effect transistor and is formed under the control gate 6. The floating gate 5 is isolated from the source 1, drain 2, and channel region 3 of the transistor by the thin gate insulating layer 8. The control gate 6 is formed on the floating gate 5 and is isolated from the source 1, drain 2, and channel region 3 of the transistor, as well as from the floating gate 5 by an insulating layer 9. The control gate 6 forms a capacitor via the insulating layer 9 together with the floating gate 5. The threshold voltage ($V_T$) is controlled depending on the amount of charge stored in the floating gate 5.

The operation of the conventional nonvolatile memory cell shown in FIGS. 1A, 1B, and 1C will be explained below. According to a program or erase operation of the cell, the threshold voltage $V_T$ of the transistor is programmed in one of two states, depending upon the amount of charge injected to the floating gate 5 from channel region 3 through thin gate insulating layer 8. The state of the programmed threshold voltage $V_T$ of the transistor is read by measuring the level of current flowing through the transistor under a condition where an appropriate voltage is applied to source 1, drain 2, and control gate 6.

More specifically, the level of current flowing in the transistor indicates whether the transistor of the cell selected by the control gate 6 is programmed in an "ON" or an "OFF" state. That is, in the read operation, the transistor logically reads "0" or "1", being electrically operated in an "ON" or an "OFF" state, respectively.

In a conventional EPROM, the programmed state is erased by irradiating ultraviolet while the erase operation is electrically performed by transferring charges stored in the floating gate 5 through a thin gate insulating layer 8 in an EEPROM or a flash memory.

FIG. 2 is an equivalent circuit diagram of a capacitor of the nonvolatile memory shown in FIGS. 1A, 1B, and 1C. Referring to FIG. 2, the floating gate 5 of the nonvolatile memory cell forms capacitors C1, C2, C3, and C4 with a source 1, drain 2, channel region 3, and control gate 6, respectively. In FIG. 2, the capacitance coupling for the floating gate 5 can be represented by a coupling ratio CC. The coupling ratio CC is obtained by the following formula (1).

$$CC = C1/(C1 + C2 + C3 + C4) \tag{1}$$

Therefore, when the nonvolatile memory cell is erased, the voltage across the floating gate 5 is determined by the voltage applied to the control gate 6. That is, the voltage value applied to the floating gate 5 depends on a value by which the voltage value across the control gate 6 is multiplied by the coupling ratio CC. As the coupling ratio CC is closer to 1.0, a nonvolatile memory cell operates more ideally in the program or erase operation.

However, the conventional nonvolatile memory cell shown in FIGS. 1A, 1B, and 1C has the following problems. In the conventional nonvolatile memory cell, in order to increase the coupling ratio, the capacitance value of capacitor C1 should be increased. In order to increase the capacitance of capacitor C1, the area of the floating gate 5 must be increased. However, if the area of the floating gate 5 is increased, then the superposed area of the control gate 6 and floating gate 5 is increased. The capacitance of capacitor C1 is thereby increased. However, the superposed area of the floating gate 5 and channel region 3 is also increased, which increases the capacitance value of capacitor C3. According to formula (1) above, the capacitance coupling ratio CC is therefore not effectively increased.

To increase the coupling ratio CC effectively, only the capacitance of capacitor C1 should be increased. This can be done in the following ways. First, a ferroelectric having a large dielectric constant can be used as the insulating layer 9 between control gate 6 and floating gate 5. Presently, a stack structure of a dielectric layer having an effective dielectric constant greater than that of a silicon layer may be used as the above-mentioned insulating layer 9. A silicon oxide layer/nitride layer/silicon oxide layer or nitride layer/silicon oxide layer may be used as the stack structure of such a dielectric layer. However, such a ferroelectric having a large dielectric constant is not reliable in a high electric field.

Alternatively, the coupling ratio CC can be increased by decreasing the thickness of the insulating layer 9 formed between control gate 6 and floating gate 5. However, if the thickness of insulating layer 9 is too thin, the reliability of the nonvolatile memory cell is sharply reduced in a high electric field. Therefore, making the insulating layer 9 thinner has encountered limitations in the manufacturing technology.

Third, to increase the coupling ratio CC, only the superposed area of floating gate 5 and control gate 6 can be increased while the superposed area of floating gate 5 and channel region 3 is not increased. Such a method is disclosed in U.S. Pat. No. 5,089,869, in which the effective surface area of capacitor C1 is increased using a texturized polysilicon process. However, this method is so complicated and difficult that the reliability of the insulating layer is not assured. This prevents the disclosed method from being easily used.

SUMMARY OF THE INVENTION

It is an object of the present invention to provide a nonvolatile memory cell and a method of fabricating the same, in which the superposed area of a control gate and floating gate is increased in order to increase the coupling ratio.

To accomplish the object of the present invention, there is provided a nonvolatile memory cell comprising a first conductivity-type substrate, an active region located in a predetermined portion of the first conductivity-type substrate, the active region including a second conductive-type source and drain and a channel region placed between the source and drain, a floating gate having an inverse T-shape and formed on the surface of the substrate between the source and drain, and a control gate formed on the surface of the floating gate.

To achieve the object of the present invention, there is further provided a method of fabricating a nonvolatile memory cell including the steps of sequentially forming a first insulating layer as a gate insulating layer and a fist conductive layer on a first conductivity-type substrate, forming a first mask having an open region on a predetermined portion of the surface of the first conductive layer, forming a second conductive layer on the surface of the first mask including the open region, and then etching back to the surface of the first mask, to form a second conductive layer pattern in the open region, removing the first mask, and sequentially forming a second insulating layer and third conductive layer on the surface of the second conductive layer pattern and an exposed portion of the first conductive layer, forming a second mask wider than the open region of the first mask on a predetermined portion of the third conductive layer formed on the second conductive layer pattern, and patterning the third conductive layer, second insulating layer and first conductive layer together, to form a first conductive layer pattern, a first insulating layer pattern as a capacitor insulating layer and a third conductive layer pattern as a control gate, and implanting a second conductivity-type impurity into the substrate using the third conductive layer pattern as an ion implanting mask, to form an impurity diffusion region as a source and drain having a predetermined spacing in the substrate.

BRIEF DESCRIPTION OF THE DRAWINGS

The accompanying drawings, which are incorporated in and constitute a part of the specification, illustrate presently preferred implementations of the invention and, together with the general description given above and the detailed description of the preferred implementations given below, serve to explain the principles of the invention.

In the Drawings.

DESCRIPTION OF THE PREFERRED EMBODIMENTS

Preferred embodiments of the present invention will be explained below with reference to the accompanying drawings. Wherever possible, the same reference numbers will be used throughout the drawings to refer to the same or like parts.

Figure 3:
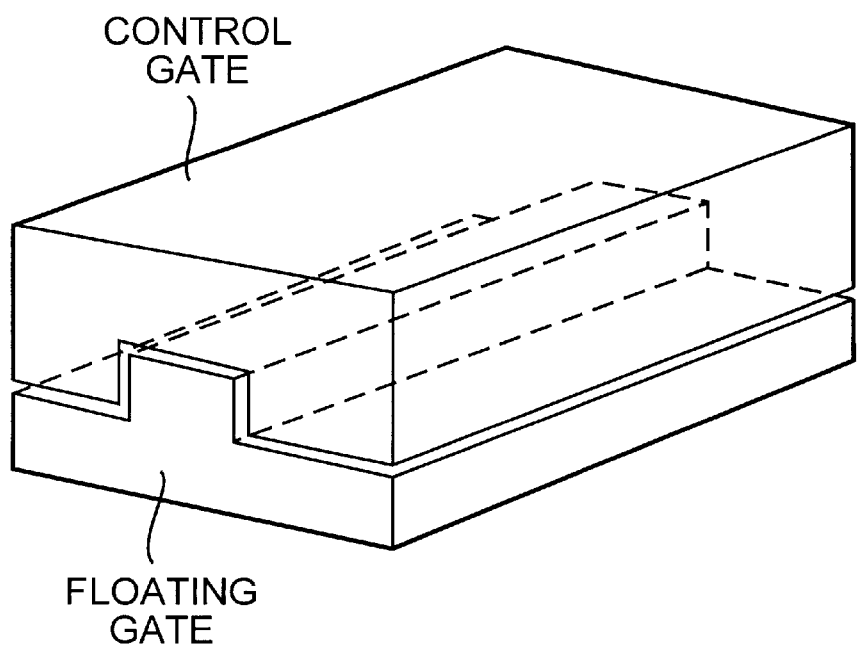
FIG. 3 is a conceptional diagram of the present invention.

FIG. 3 is a conceptional diagram of the present invention. Referring to FIG. 3, a floating gate has an inverse, or upside-down, T-shape, and a control gate covers the overall surface of the floating gate in order to increase the superposed area of the floating gate and the control gate of a nonvolatile memory cell.

Figure 4A:
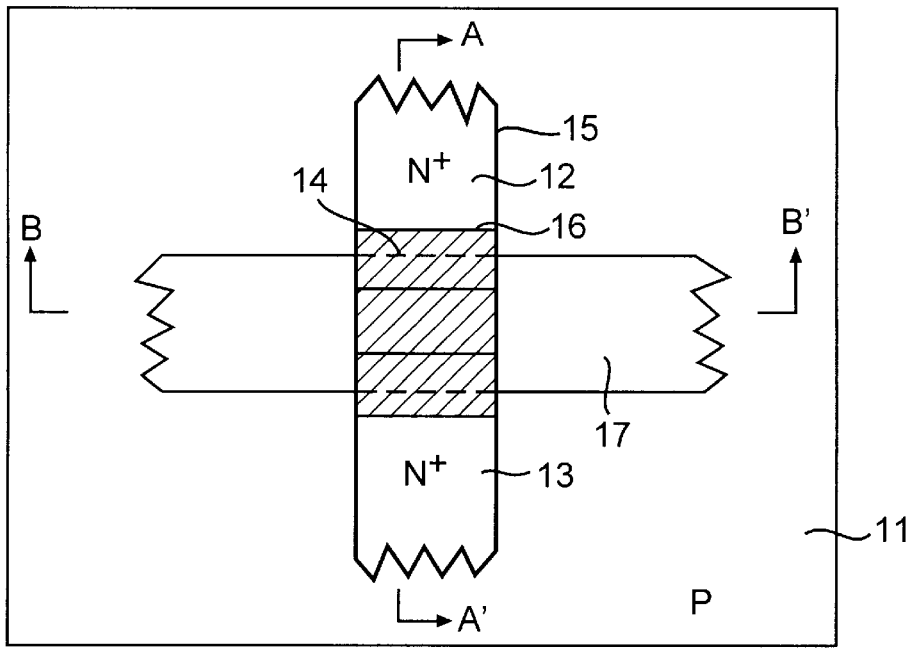
FIG. 4A is a plan view of a nonvolatile memory cell according to a first embodiment of the present invention.

FIG. 4A is a plan view of a nonvolatile memory cell according to a first embodiment of the present invention. Referring to FIG. 4A, the nonvolatile memory cell of the first embodiment of the present invention is composed of a first conductivity-type substrate 11 (P-type substrate in FIG. 4A) and an active region 15 located in a predetermined portion of the first conductivity-type substrate 11. The nonvolatile memory cell also including a second conductivity-type, for instance, N+ type, source 12 and drain 13 and a channel region 14 placed between the source 12 and drain 13. A floating gate 16, having an inverse T-shape, is formed between the source 12 and drain 13. A control gate 17 is formed on the floating gate 16.

In the first embodiment of the present invention, the inverse T-shape of the floating gate 16 is formed in the same direction as the direction in which control gate 17 extends, but perpendicular to the direction of the active region 15. As shown in FIG. 4A, the active region 15 and the control gate 17 are formed perpendicular to each other. The floating gate 16 is formed on first conductivity-type substrate 11 between source 12 and drain 13, and has an inverse T-shape in a direction perpendicular to the active region 15. That is, an edge of the floating gate 16 is superposed on a portion of each of the source 12 and drain 13. The source 12 and drain 13, the channel region 14, and the floating gate 16 form a MOS transistor.

Figure 4B:
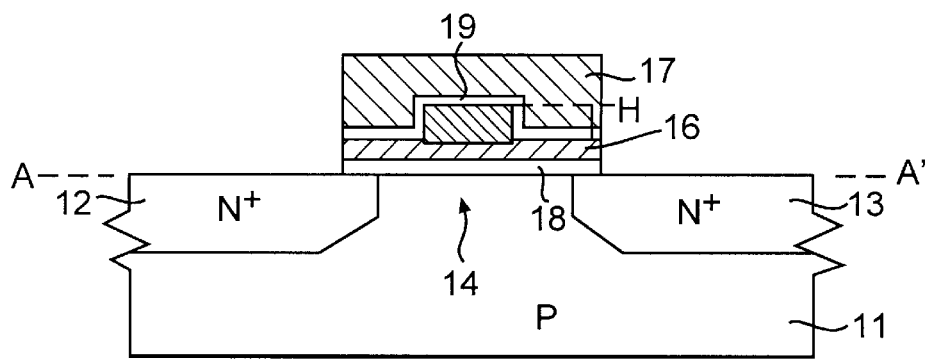
FIG. 4B is a cross-sectional view of the nonvolatile memory cell, taken along line A–A' of FIG. 4A.

FIG. 4B is a cross-sectional view of the nonvolatile memory cell, taken along line A–A' of FIG. 4A. Referring to FIG. 4B, according to a first embodiment of the present invention, second conductivity-type, that is, N+ type, source 12 and drain 13 are formed on the surface of first conductivity-type substrate 11, with a predetermined spacing between them. The region between source 12 and drain 13 becomes channel region 14.

A gate insulating layer 18 is formed on the surface of the substrate 11, specifically, on the channel-region 14 between the source 12 and drain 13. One edge of gate insulating layer 18 is superposed on a portion of each of the source 12 and drain 13. According to the present invention, gate insulating layer 18 is sufficiently thin to enable electron tunneling. Floating gate 16, insulating layer 19 and control gate 17 are sequentially formed on the gate insulating layer 18. Here, insulating layer 19 is formed to insulate the floating gate 16 from the control gate 17. In FIG. 4B, the height H of the upper portion of the inverse T-shaped floating gate 16 can be adjusted to obtain a desired capacitance between the control gate 17 and the floating gate 16.

Figure 4C:
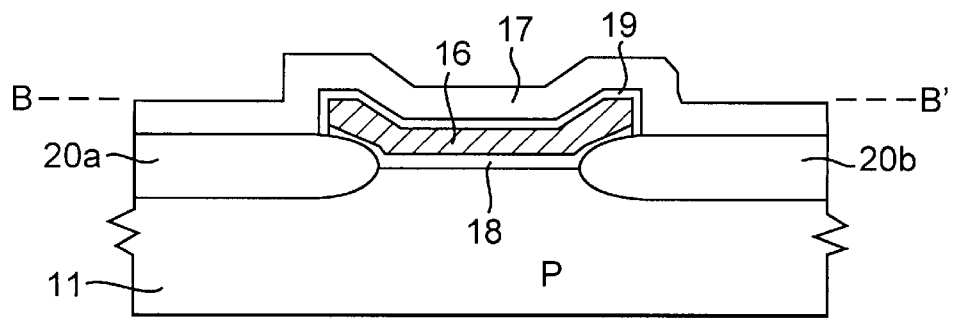
FIG. 4C is a cross-sectional view of the nonvolatile memory cell, taken along line B–B' of FIG. 4A.

FIG. 4C is a cross-sectional view of the nonvolatile memory cell, taken along line B—B of FIG. 4A. Referring to FIG. 4B, two channel stop regions 20a and 20b are formed on a predetermined portion of first conductivity-type substrate 11 in order to electrically isolate adjacent cells from each other in a nonvolatile memory cell array. Here, the region of the P-type substrate 11 between the channel stop regions 20a and 20b defines the width of the active region 15, shown in FIG. 4A.

One edge of floating gate 16 is superposed on each of the channel stop regions 20a and 20b. The gate insulating layer 18 is formed on a portion of the substrate 11 between the channel stop regions 20a and 20b. The floating gate 16, insulating layer 19, and control gate 17 are sequentially formed on the gate insulating layer 18.

In FIGS. 4B and 4C, the material of the first conductivity type substrate 11 can be P-type silicon. The source 12 and drain 13 may be N+ type impurity diffusion regions formed in substrate 11, and the material of floating gate 16 and control gate 17 may be N+ type polysilicon. The insulating layer 19, isolating the control gate 17 from the floating gate 16, may be a silicon oxide layer or a stack-structure insulating layer such as a silicon oxide layer/nitride layer/silicon oxide layer (ONO) or a nitride layer/silicon oxide layer (NO).

As described above, in the nonvolatile memory cell according to the present invention, floating gate 16, as a gate of the MOS transistor, has an inverse T-shape in the same direction as the direction in which the control gate 17 extends. The floating gate 16 is electrically isolated from the source 12, drain 13, and channel region 14 of the MOS transistor by the thin gate insulating layer 18. The control gate 17 is electrically isolated from the floating gate 16, source 12, drain 13, and channel region 14 by the gate insulating layer 18 and the insulating layer 19, and forms a capacitor together with the floating gate 16 via the insulating layer 19.

Figure 1A:
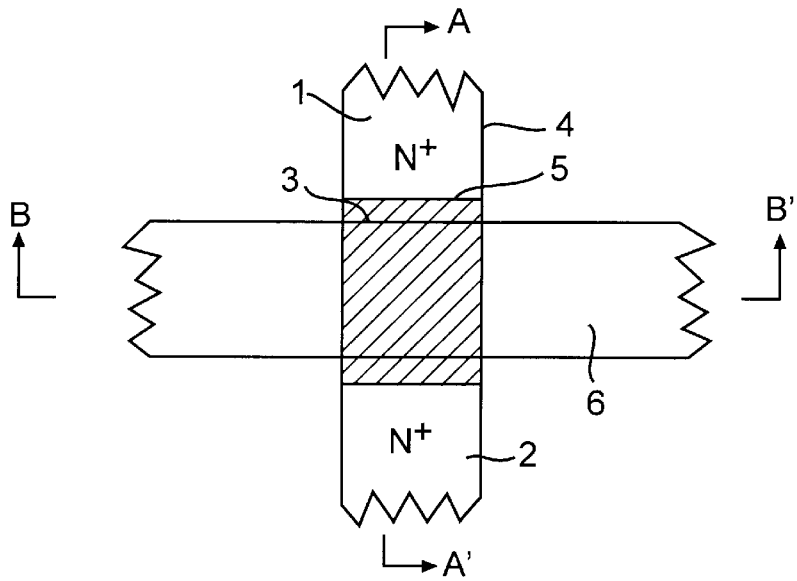
FIG. 1A is a plan view of a conventional nonvolatile memory cell.
Figure 1B:
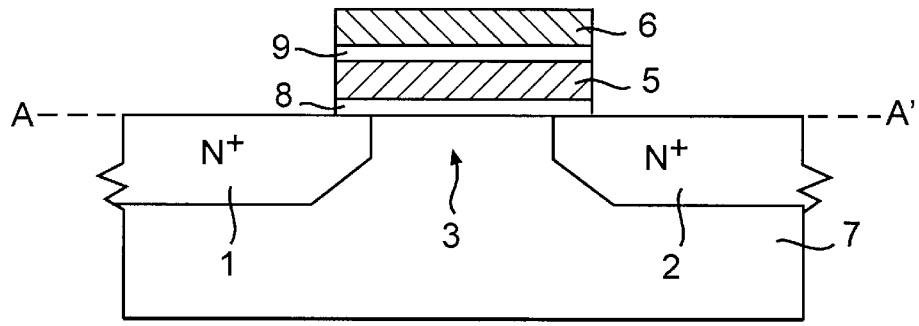
FIG. 1B is a cross-sectional view of the nonvolatile memory cell, taken along line A–A' of FIG. 1A.
Figure 1C:
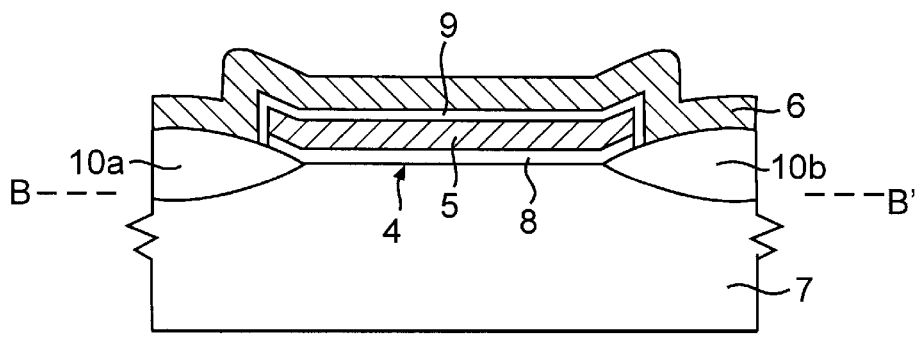
FIG. 1C is a cross-sectional view of the nonvolatile memory cell, taken along line B–B' of FIG. 1A.
Figure 2:
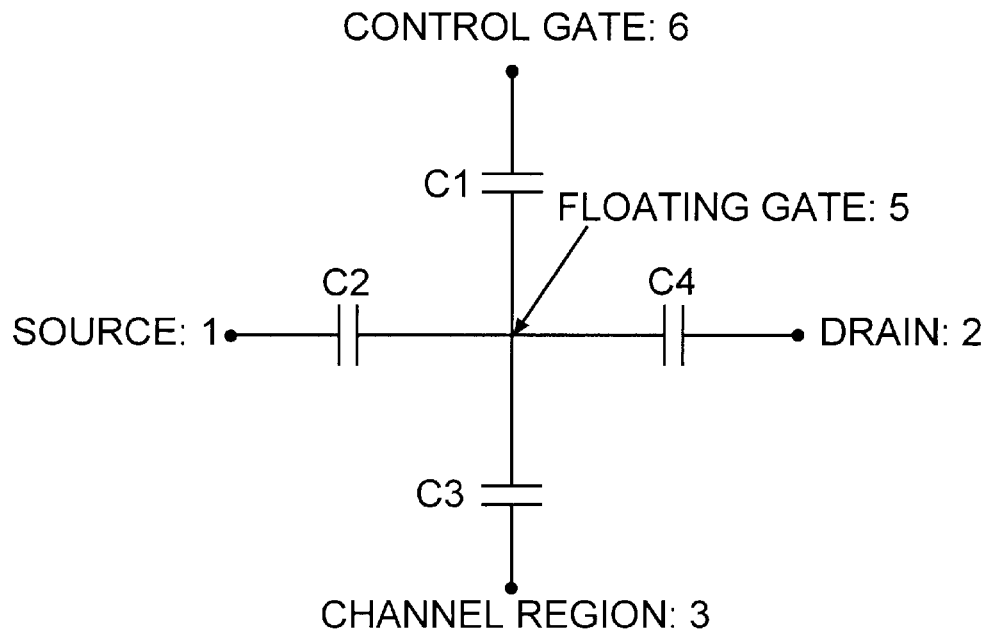
FIG. 2 is an equivalent circuit diagram of the capacitance of the conventional nonvolatile memory cell shown in FIGS. 1A–1C.

The equivalent circuit of the nonvolatile memory cell of the first embodiment of the present invention showing the arrangement of the capacitors is the same as the prior art, shown in FIG. 2, and accordingly will not be explained. Additionally, the basic program/erase/read operation of the nonvolatile memory cell of the present invention is the same as the prior art, and will not be described.

A method of fabricating the nonvolatile memory cell according to the first embodiment of the present invention will be explained below with reference to FIGS. 5A to 5H. FIGS. 5A to 5H are cross-sectional views showing a manufacturing process of the nonvolatile memory cell, taken along line A–A' of FIG. 4A.

Figure 5A:
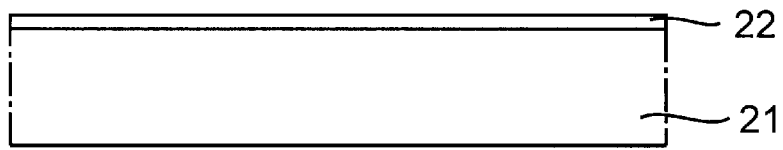
FIGS. 5A to 5H are cross-sectional views showing a manufacturing process of a nonvolatile memory cell according to the present invention.
Figure 5B:
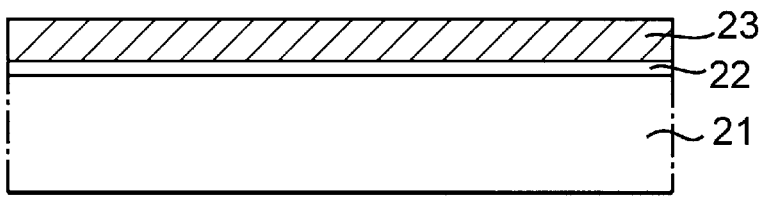

First, as shown in FIGS. 5A and 5B, a first conductivity-type substrate 21 is prepared, and a first insulating layer 22 and first conductive layer 23 are sequentially formed on the first conductivity-type substrate 21. The substrate 21 may be a lightly doped P-type silicon substrate. The first insulating layer 22 serves as a gate insulating layer and is sufficiently thin to enable electron tunneling. First insulating layer 22 may be formed of a silicon oxide, and the silicon oxide layer may be formed by thermal oxidation or chemical vapor deposition (CVD). First conductive layer 23 may be formed of heavily doped N+ type polysilicon.

Figure 5C:
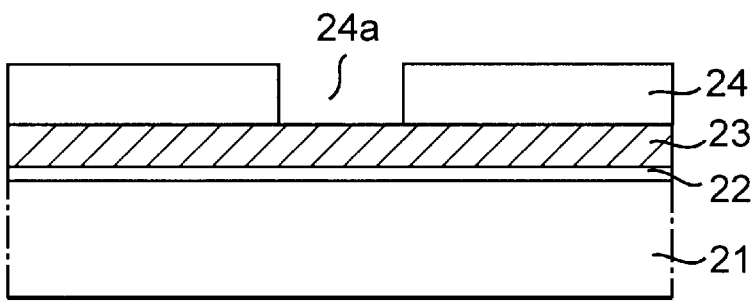

As shown in FIG. 5C, a first mask having an open region 24a is formed on the first conductive layer 23. The open region 24a is made to form the upper portion, that is, the protruding portion, of the floating gate 16 of FIG. 4B.

Figure 5D:
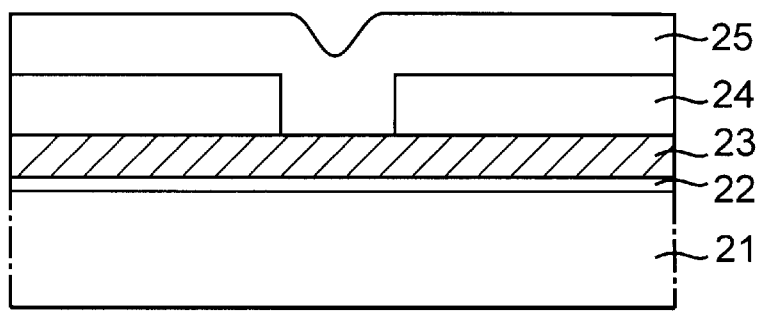
Figure 5E:
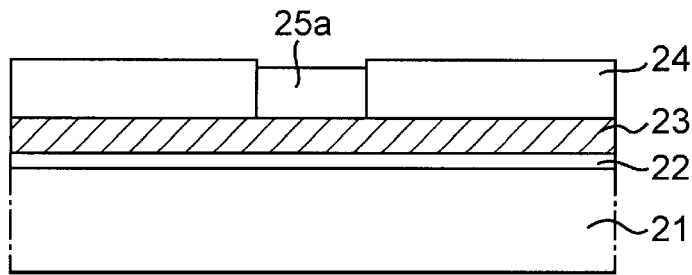

As shown in FIG. 5D, a second conductive layer 25 is formed to completely fill the open region 24a of first mask 24. Then, as shown in FIG. 5E, second conductive layer 25 is etched back to the surface of first mask 24, to form a second conductive layer pattern 25a in the open region 24a. Second conductive layer pattern 25a serves as the upper portion of the inverse T-shape floating gate 16 shown in FIG. 4B.

Figure 5F:
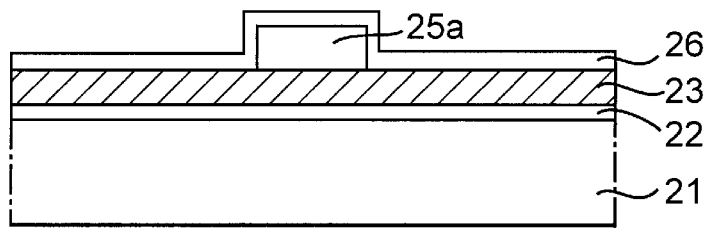
Figure 5G:
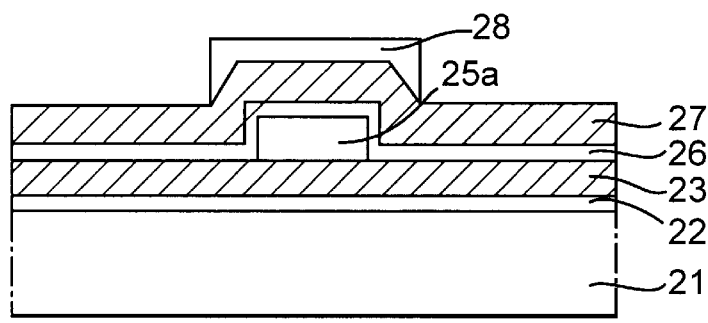

As shown in FIGS. 5F and 5G, first mask 24 is removed and then a second insulating layer 26 and third conductive layer 27 are sequentially formed. The third conductive layer 27 extends in the same direction as the direction in which the open region 24a of first mask 24 and the first conductive layer 23 extend. Then, a second mask 28 wider than the open region 24a of first mask 24 is formed on a predetermined portion of third conductive layer 27.

Figure 5H:
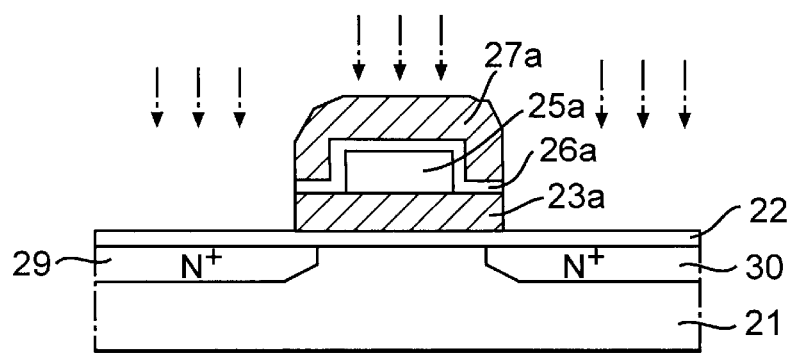

As shown in FIG. 5H, third conductive layer 27, second insulating layer 26, and first conductive layer 23 are patterned together to form a first conductive layer pattern 23a, second insulating layer pattern 26a, and third conductive layer pattern 27a, respectively. First conductive layer 23, second conductive layer 25 and third conductive layer 27 may be formed of N+ type polysilicon. Second insulating layer 26 may be a silicon oxide layer or a stack-structured insulating layer. The stack-structured insulating layer may be ONO or NO.

Then, second mask 28 is stripped and a high concentration of a second conductivity-type (N+ type) impurity ion is ion-implanted into the substrate 21 using third conductive layer pattern 27a as an ion implanting mask to form an impurity diffusion region having a predetermined spacing between a source 29 and drain 30 in the substrate 21.

As shown in FIG. 5H, first conductive layer pattern 23a, the lower portion of the floating gate having the inverse T-shape, forms the floating gate along with second conductive layer pattern 25a.

Figure 6A:
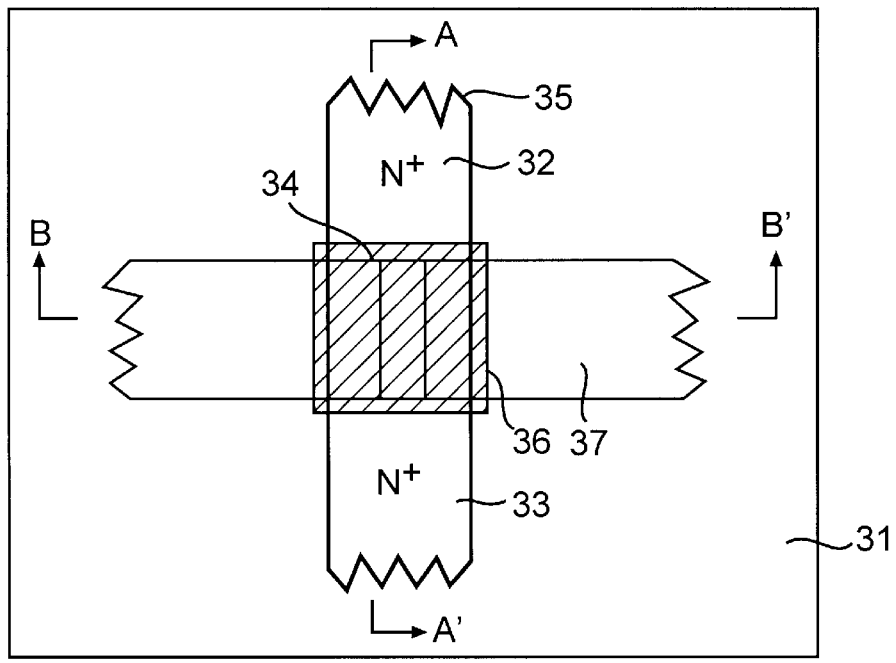
FIG. 6A is a plan view of a nonvolatile memory cell according to a second embodiment of the present invention.
Figure 6B:
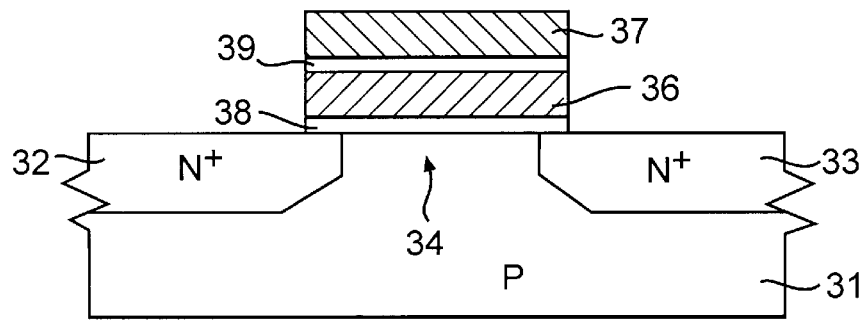
FIG. 6B is a cross-sectional view of the nonvolatile memory cell, taken along line A–A' of FIG. 6A.
Figure 6C:
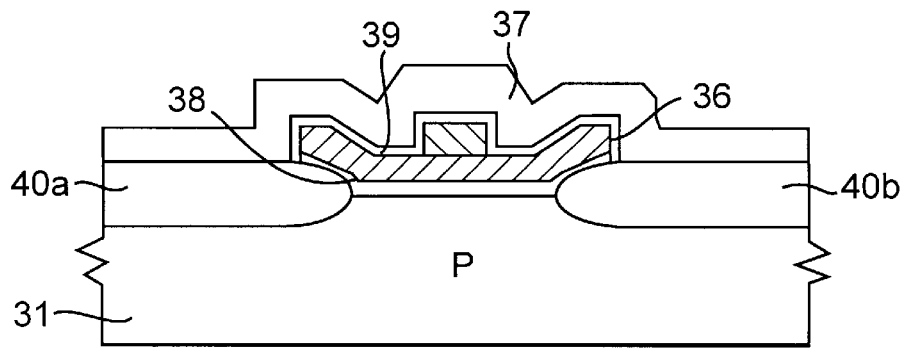
FIG. 6C is a cross-sectional view of the nonvolatile memory cell, taken along line B–B' of FIG. 6A.

FIGS. 6A, 6B, and 6C show a nonvolatile memory cell according to a second embodiment of the present invention. In FIGS. 6A, 6B, and 6C, it is noted that the superposed surface area of a floating gate and control gate is increased as compared with a conventional nonvolatile memory cell, similar to FIGS. 4A, 4B, and 4C.

According to the second embodiment of the present invention, the floating gate, having an inverse T-shape, is formed in the same direction as the direction in which the active region extends, but perpendicular to the direction in which the control gate extends.

FIG. 6A is a plan view of the nonvolatile memory cell according to the second embodiment of the present invention. Referring to FIG. 6A, the nonvolatile memory cell according to the second embodiment of the present invention is composed of a first conductivity-type substrate 31, shown as a P-type substrate, and an active region 35 located in a predetermined portion of the first conductivity-type substrate 31. A second conductivity-type, shown as N+ type, source 32 and drain 33 are formed on the substrate 31 and a channel region 34 is placed between the source 32 and drain 33. A floating gate 36, having an inverse T-shape, is formed on the surface of the substrate 31 between the source 32 and drain 33, and a control gate 37 is formed on the surface of the floating gate 36. The inverse T-shape of the floating gate 36 is formed perpendicular to the direction in which control gate 37 extends, but in the same direction as the active region 35.

FIG. 6B is a cross-sectional view of the nonvolatile memory cell, taken along line A–A' of FIG. 6A. Referring to FIG. 6B, second conductivity-type source 32 and drain 33 are formed on the surface of first conductivity-type substrate 31, with a predetermined spacing therebetween. The region between source 32 and drain 33 becomes channel region 34.

A gate insulating layer 38 is formed on the surface of the substrate 31 between source 32 and drain 33. One edge of gate insulating layer 38 is superposed on a portion of each of source 32 and drain 33. Floating gate 36, capacitor insulating layer 39, and control gate 37 are sequentially formed on the gate insulating layer 38.

FIG. 6C is a cross-sectional view of the nonvolatile memory cell, taken along line B–B' of FIG. 6A. Referring to FIG. 6C, two channel stop regions 40a and 40b are formed on a predetermined portion of first conductivity-type substrate 31 in order to electrically isolate adjacent cells from each other in a nonvolatile memory cell array. The area between the channel stop regions 40a and 40b defines the width of the active region 15. The gate layer 38 is formed on a portion of the substrate 31 between the channel stop regions 40a and 40b. Each edge of gate insulating layer 38 is superposed on a portion of each of the channel regions 40a and 40b. The floating gate 36, capacitor insulating layer 39, and control gate 37 are sequentially formed on the gate insulating layer 38.

As described above, the second embodiment of the present invention is similar to the first embodiment but differs therefrom in that the floating gate 36, having an inverse T-shape, is formed perpendicular to the direction in which control gate 37 extends, but in the same direction as the direction in which active region 35 extends. Except for this difference, the manufacturing process of the second embodiment is the same as that of the first embodiment, and is accordingly omitted.

As described above, the embodiments of the present invention have the following advantages. First, the floating gate has an inverse T-shape, increasing the superposed surface area of the floating gate and control gate. Therefore, capacitance C1 of the floating gate and control gate is increased as is the capacitance coupling ratio CC. Moreover, a desired surface area of the capacitor C1 can be obtained by controlling the height H of the upper portion of the inverse T-shape, as shown in FIG. 4B.

Second, the desired surface area of the capacitor can be obtained regardless of the length of the channel region so that the present invention is useful for a nonvolatile memory cell including a MOS transistor having a short channel region.

What is claimed is:

1. A method of fabricating a nonvolatile memory cell comprising the steps of:

sequentially forming a first insulating layer as a gate insulating layer and a first conductive layer on a first conductivity-type substrate having a first surface;

forming a first mask, having a first surface and having an open region, on a predetermined portion of the first surface of the first conductive layer;

forming a second conductive layer on the first surface of the first mask;

etching back to the first surface of the first mask to form a second conductive layer pattern with a first surface in the open region;

removing the first mask;

sequentially forming a second insulating layer and third conductive layer on the first surface of the second conductive layer pattern and an exposed portion of the first conductive layer;

forming a second mask wider than the open region of the first mask on a predetermined portion of the third conductive layer on the second conductive layer pattern, and patterning the third conductive layer, the second insulating layer, and the first conductive layer to form, respectively, a first conductive layer pattern, a first insulating layer pattern, as a capacitor insulating layer, and a third conductive layer pattern, as a control gate; and implanting a second conductivity-type impurity into the substrate using the third conductive layer pattern as an ion implanting mask, to form impurity diffusion regions as a source and a drain, the source and drain having a predetermined distance therebetween.

2. The method of fabricating a nonvolatile memory cell as claimed in claim 1, wherein the first insulating layer is formed sufficiently thin to enable electron tunneling.

3. The method of fabricating a nonvolatile memory cell as claimed in claim 1, wherein the first insulating layer is formed by one of thermal oxidation and CVD.

4. The method of fabricating a nonvolatile memory cell as claimed in claim 3, wherein the thermal oxidation is LOCOS.

5. The method of fabricating a nonvolatile memory cell as claimed in claim 1, wherein the first insulating layer is formed of a silicon oxide layer.

6. The method of fabricating a nonvolatile memory cell as claimed in claim 1, wherein the first and second conductive layer patterns form an inverse T-shape floating gate.

7. The method of fabricating a nonvolatile memory cell as claimed in claim 1, wherein the first conductivity-type substrate is a P type silicon substrate, and the second conductivity-type source and drain are N+ type impurity diffusion regions.

8. The method of fabricating a nonvolatile memory cell as claimed in claim 1, wherein the open region of the first mask extends in a same direction as a direction in which the third conductive layer pattern extends.

9. The method of fabricating a nonvolatile memory cell as claimed in claim 1, wherein the open region of the first mask extends perpendicular to a direction in which the third conductive layer pattern extends.

10. The method of fabricating a nonvolatile memory cell as claimed in claim 1, wherein the first, second, and third conductive layers are formed of N+ type polysilicon.

11. The method of fabricating a nonvolatile memory cell as claimed in claim 1, wherein the second insulating layer is formed of a silicon oxide layer.

12. The method of fabricating a nonvolatile memory cell as claimed in claim 1, wherein the second insulating layer is formed of a stacked insulating layer.

13. The method of fabricating a nonvolatile memory cell as claimed in claim 12, wherein the stacked insulating layer is one of ONO and NO.

* * * * *